(12) United States Patent
Peng et al.

(10) Patent No.: US 8,138,557 B2
(45) Date of Patent: Mar. 20, 2012

(54) LAYOUT STRUCTURE OF MOSFET AND LAYOUT METHOD THEREOF

(75) Inventors: Kuo-Wei Peng, Taipei County (TW); Zhong-Wei Liu, Wuxi (CN); Qian-Hua Zhou, Wuxi (CN)

(73) Assignee: Green Solution Technology Co., Ltd., New Taipei (TW)

( * ) Notice: Subject to any disclaimer, the term of this patent is extended or adjusted under 35 U.S.C. 154(b) by 98 days.

(21) Appl. No.: 12/616,142

(22) Filed: Nov. 11, 2009

(65) Prior Publication Data

US 2011/0113397 A1 May 12, 2011

(51) Int. Cl.
*H01L 29/41* (2006.01)
(52) U.S. Cl. .... 257/401; 257/341; 257/208; 257/E29.12
(58) Field of Classification Search .................. 257/207, 257/208, 211, 691, 401, 341, E29.12, 775, 257/E23.153
See application file for complete search history.

(56) References Cited

U.S. PATENT DOCUMENTS

| H842 H | * | 11/1990 | Ochs .............................. 257/767 |
| 5,672,894 A | * | 9/1997 | Maeda et al. .................. 257/343 |
| 2009/0085215 A1 | * | 4/2009 | Stecher .......................... 257/762 |

* cited by examiner

*Primary Examiner* — Victor A Mandala
*Assistant Examiner* — Scott Stowe
(74) *Attorney, Agent, or Firm* — Jianq Chyun IP Office

(57) ABSTRACT

A layout structure of a MOSFET is provided. The layout structure of the MOSFET includes a plurality of MOSFET cells, a first source/drain metal bus structure and a second source/drain metal bus structure. The first source/drain metal bus structure is electrically connected to first sources/drains of the MOSFET cells, and a width thereof is gradually decreased in a predetermined direction. The second source/drain metal bus structure is electrically connected to second sources/drains of the MOSFET cells, and a width thereof is gradually increased in the predetermined direction.

8 Claims, 4 Drawing Sheets

LAYOUT STRUCTURE OF MOSFET AND LAYOUT METHOD THEREOF

BACKGROUND OF THE INVENTION

1. Field of the Invention

The invention relates to a layout structure of a MOSFET and a layout method thereof. More particularly, the invention relates to a layout structure of a MOSFET in which a plurality of MOSFET cells substantially has the same amount of the current passing there through and a layout method thereof.

2. Description of Related Art

Currently, for the main devices of the computer, such as the CPU and the memory, their operation voltages have gradually become lower. Under the situation in which the required power consumption can not become lower in the same ratio, the required current of these devices for the operation gradually becomes larger. Accordingly, for a MOSFET severing as a power switch in the application, the maximum with standing current of the MOSFET also becomes higher along with the required current. However, with the development of the high integration in the integrated circuit, the width of the metal conducting wire connecting the source and the drain of the MOSFET would be limited, so that the current density of the metal conducting wire is increased, and the metal conducting wire has a serious voltage drop. The serious voltage drop causes the conducting current conducted in the MOSFET cells of the MOSFET to be non-uniform. The increased current density of the metal conducting wire causes the electron migration to become obvious. Especially, if the conducting current is non-uniform, the MOSFET cell that conducts the larger conducting current is easily destroyed due to the electron migration. Accordingly, the conventional power MOSFET has either the character of the large withstanding current or the character of the high integration.

FIG. 1 is a schematic view of a conventional layout structure of the MOSFET. Referring to FIG. 1, in the MOSFET structure, the gate conducting wire has short strip-shape gate patterns 31 and long strip-shape gate patterns 32, which wiggles and connects the gates of each MOSFET cell in the MOSFET structure. The source regions 14 and the drain regions 24 of each MOSFET cell in the MOSFET structure are alternately located between the long strip-shape gate patterns 32. The drain metal conducting wires 21 have a plurality of finger-like patterns 22, and the source metal conducting wires 11 have a plurality of finger-like patterns 12. The finger-like patterns 22 and 12 are alternately disposed between each other. Each of the finger-like patterns 22 is located on a drain region 24, and is electrically connected to the drains of the MOSFET cells through the drain contact holes 23. Similarly, each of the finger-like patterns 12 is located on a source region 14, and is electrically connected to the sources of the MOSFET cells through the source contact holes 13. Moreover, each of the finger-like patterns 22 has a plurality of drain contact holes 23 to be connected to the drain region 24. Each of the finger-like patterns 12 has a plurality of source contact holes 13 to be connected to the source region 14.

In the conventional layout structure of the MOSFET, the over long source connecting wires and the over long drain connecting wires cause the serious voltage drop. FIG. 2 is a schematic view of the gate, the drain, and the source voltages of the MOSFET cells in the MOSFET structure shown in FIG. 1 changing along with the distance current flowing through the connecting wires. Herein, the line Svol represents the source voltage, the line Dvol represents the drain voltage, and the line Gvol represents the gate voltage. For clearly describing the relationship between FIG. 1 and FIG. 2, a current direction Z is defined in FIG. 1 herein. Accordingly, the current I flows into the MOSFET from the drain metal conducting wires 21, and flows out thereof from the source metal conducting wires 11. Due to the current, the source voltage Svol and the drain voltage Dvol are decreased along with the distance, and the differences between the source voltage Svol and the ideal source voltage Svol' and between the drain voltage Dvol and the ideal drain voltage Dvol' gradually become larger. Moreover, there is no current flowing into the gate of the MOSFET, so that the gate voltage Gvol does not change along with distance. In this case, the gate-source voltages $V_{gs}$ of each MOSFET cell are different, and it causes the current conducted in each MOSFET cell to be different. Especially, for the requirement of the large current, the number of the MOSFET cells is increased, and the lengths of the metal conducting wires are also increased, so that the current conducted in each MOSFET cell is much different.

Accordingly, the design for the MOSFET structure has the intrinsic defect and limitation, and it can not satisfy the requirement of the large current in recent advancement.

SUMMARY OF THE INVENTION

Accordingly, the MOSFET structure in the related art has the issue of which the current density is not uniform, so that the electron migration is obvious, thereby causing the maximum withstanding current of the MOSFET can not be enhanced effectively. In an embodiment of the invention, the width of the metal structure is adjusted along with the distance, so that the resistance per unit length is reduced along with the distance, and thereby the current density is redistributed. Accordingly, the uniformity of the current conducted in the MOSFET cells of the MOSFET structure can be enhanced.

Accordingly, an embodiment of the embodiment provides a layout structure of a MOSFET including a plurality of MOSFET cells, a first source/drain metal bus structure, and a second source/drain metal bus structure. The first source/drain metal bus structure is electrically connected to first sources/drains of the MOSFET cells, and a width of the first source/drain metal bus structure is gradually decreased in a predetermined direction. The second source/drain metal bus structure is electrically connected to second sources/drains of the MOSFET cells, and a width of the second source/drain metal bus structure is gradually increased in the predetermined direction.

Another embodiment of the embodiment also provides a layout method of a MOSFET includes following steps. First of all, the first source/drain metal bus structure is formed on a plurality of MOSFET cells, wherein the first source/drain metal bus structure is electrically connected to first sources/drains of the MOSFET cells, and a width of the first source/drain metal bus structure is gradually decreased in a predetermined direction. Next, a second source/drain metal bus structure is formed on the MOSFET cells, wherein the second source/drain metal bus structure is electrically connected to second sources/drains of the MOSFET cells, and a width of the second source/drain metal bus structure is gradually increased in the predetermined direction.

Moreover, in an embodiment of the invention, third source/drain metal bus structure and fourth source/drain metal bus structure are further provided to share the conducting current, so that the current density becomes smaller, and thereby the MOSFET cells can withstand the higher conducting current.

It is to be understood that both the foregoing general description and the following detailed description are exemplary, and are intended to provide further explanation of the invention as claimed. In order to make the features and the advantages of the present invention comprehensible, exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
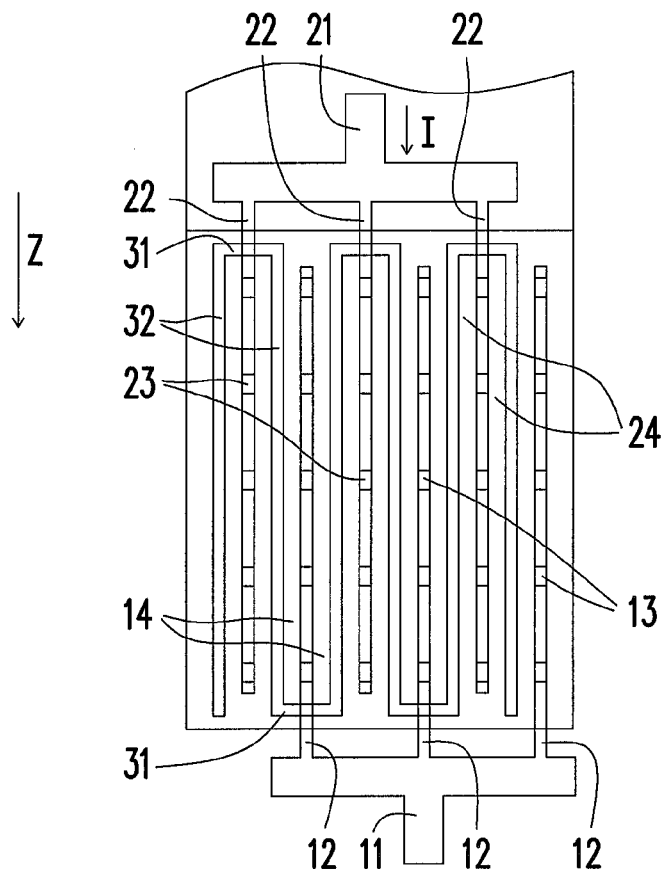
FIG. 1 is a schematic view of a conventional layout structure of the MOSFET.
Figure 2:
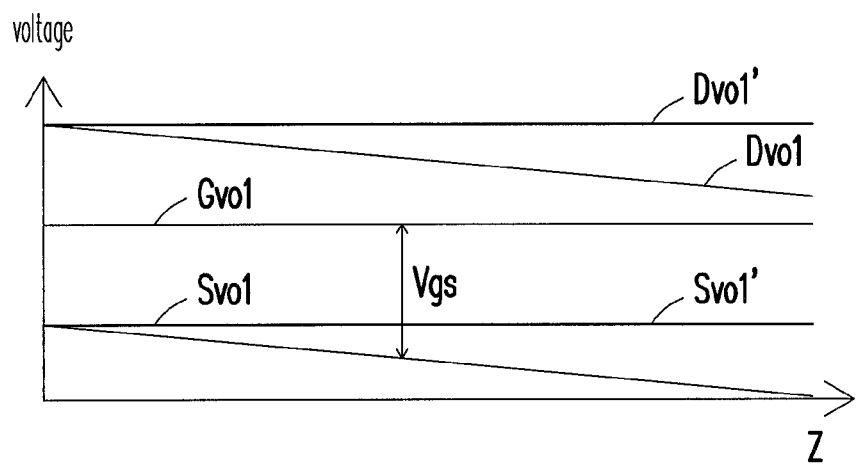
FIG. 2 is a schematic view of the gate, the drain, and the source voltages of the MOSFET cells in the MOSFET structure shown in FIG. 1 changing along with the lengths of the connecting wires.
Figure 3:
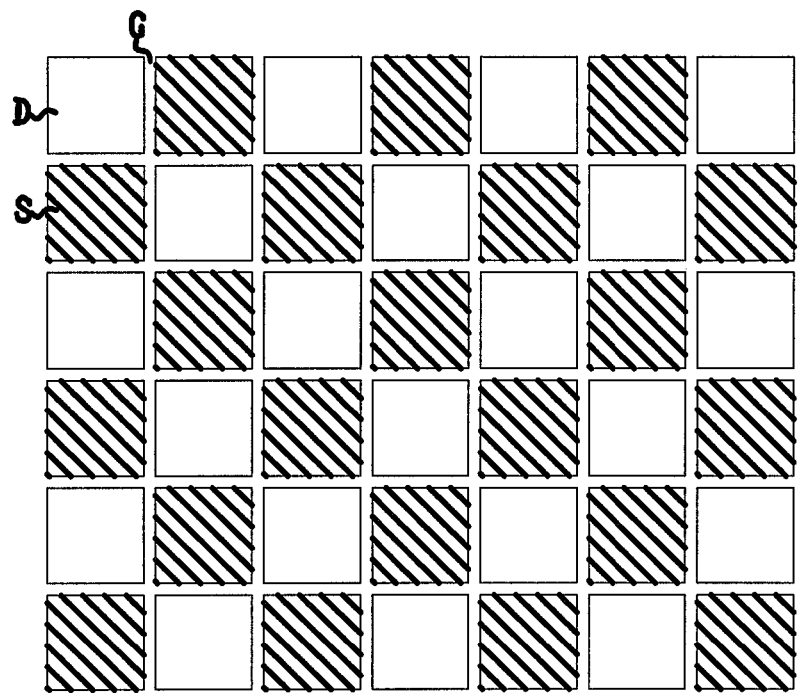
FIG. 3 is a schematic distribution of MOSFET cells in a layout structure of a MOSFET according to an embodiment of the invention.

FIG. 3 is a schematic distribution of MOSFET cells in a layout structure of a MOSFET according to an embodiment of the invention. Referring to FIG. 3, for convenience, an n-type MOSFET is exemplary in the embodiment of the invention. In the present embodiment, sources S and drains D of the MOSFET cells are arranged alternately. In the vertical and the horizontal directions, there is a drain D (a source S) between adjacent two sources S (adjacent two drains D). The gate G is located between each pair of the sources S and the drains D, and the pattern is a net-like pattern. Accordingly, each of the sources S (the drains D) has four corresponding drains D (sources S) therearound, so that the integration of the MOSFET layout structure is enhanced greatly.

Figure 4:
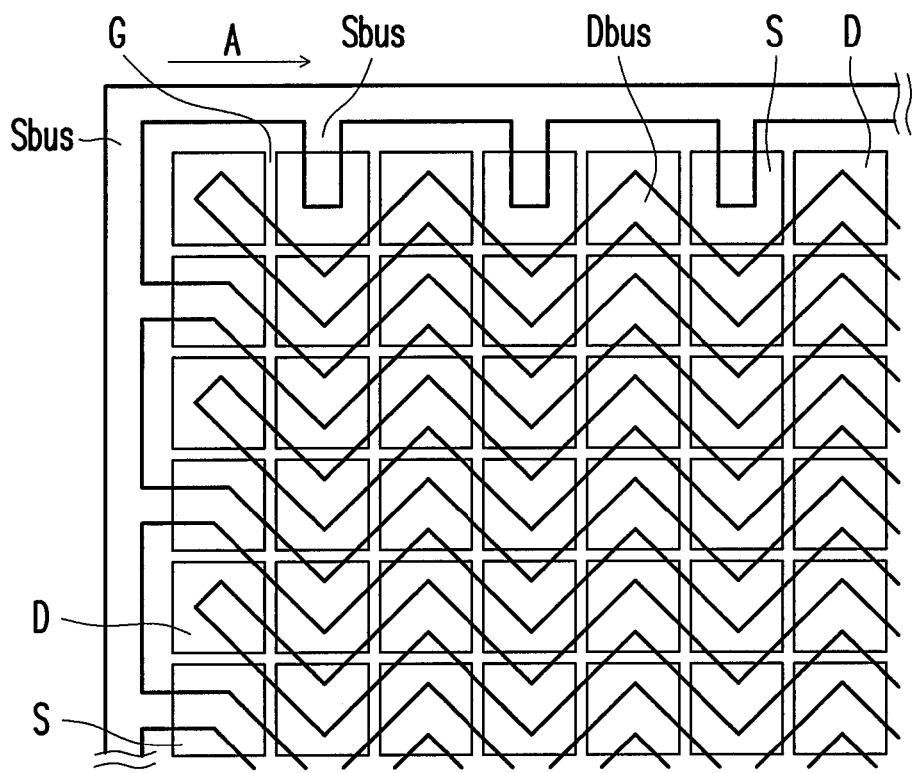
FIG. 4 is a schematic view of conducting wires in the layout structure of the MOSFET according to an embodiment of the invention.

FIG. 4 is a schematic view of conducting wires in the layout structure of the MOSFET according to an embodiment of the invention. The pattern of source conducting wire Sbus is a saw-toothed pattern. The source conducting wires Sbus are parallel in a first direction A, and are configured to electrically connect the sources S of the MOSFET cells. Similarly, the pattern of drain conducting wire Dbus is also the saw-toothed pattern. The drain conducting wires Dbus are parallel in the first direction A, and are configured to electrically connect the drains D of the MOSFET cells. Accordingly, the structure is advantageous to increase the connecting area for connecting to the upper metal layer, thereby more effectively sharing the current.

Figure 5A:
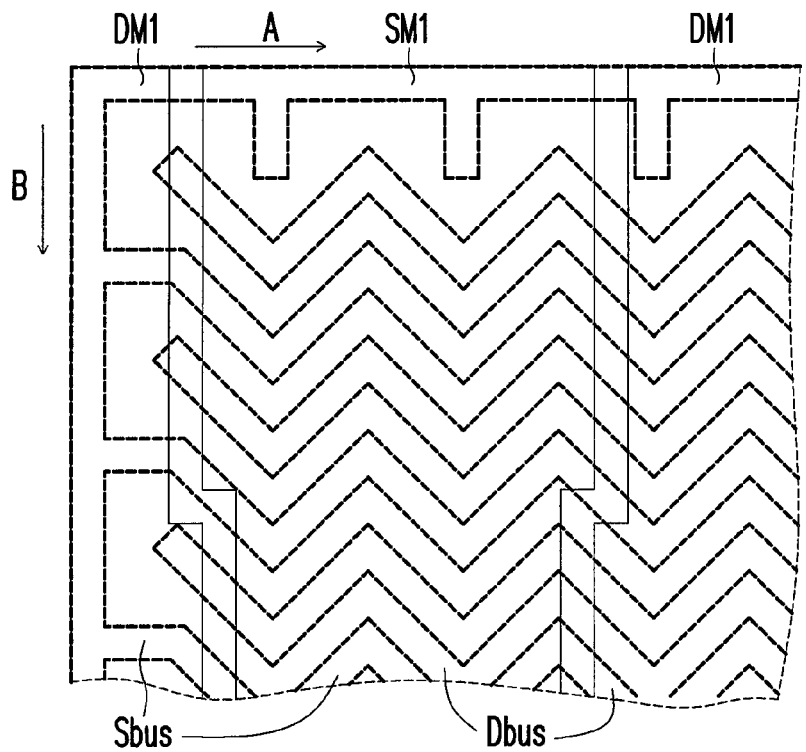
FIG. 5A and FIG. 5B are respectively a partial schematic view and an entire schematic view of the metal layer structure in the layout structure of the MOSFET according to an embodiment of the invention.
Figure 5B:
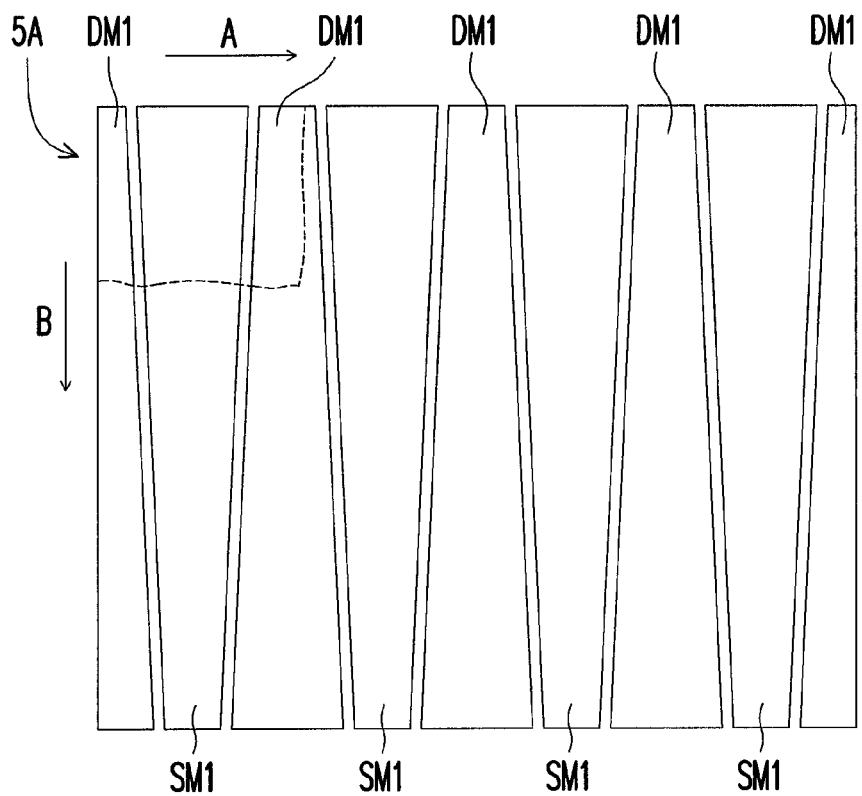

FIG. 5A and FIG. 5B are respectively a partial schematic view and an entire schematic view of the first metal layer structure in the layout structure of the MOSFET according to an embodiment of the invention. Referring to FIG. 5A, the first metal layer structure, comprising a first source metal bus structure SM1 and a second drain metal bus structure DM1, is formed on the conducting wire structure. The first source metal bus structure SM1 and the second drain metal bus structure DM1 are respectively electrically connected to the sources and the drains of the MOSFET cells through the source conducting wire Sbus and the drain conducting wire Dbus. The first source metal bus structure SM1 has a plurality of extending arms. The widths of the extending arms are gradually decreased in a step-like manner, as shown in FIG. 5A, or in other similar manners, along a second direction B perpendicular to the first direction A. The second drain metal bus structure DM1 has a plurality of extending arms. The widths of the extending arms are gradually increased in the step-like manner, as shown in FIG. 5A, or in other similar manners, along the second direction B. Referring to FIG. 5B, the part view shown in FIG. 5A is the region 5A circled in the dot-line in FIG. 5B. In macroscopic perspective, the first source metal bus structure SM1 and the second drain metal bus structure DM1 both show the trapezoids, and the trapezoids shown by them are upside-down. Furthermore, the areas of the first source metal bus structure SM1 and the second drain metal bus structure DM1 are substantially equal. According to this design, the source and the drain of the MOSFET structure can be exchanged in the embodiment of the invention, thereby increasing the convenience for the users. Moreover, the MOSFET is electrically connected to the external device through the bonding pads by wire bonding to input or output the current. Accordingly, the current flows into the MOSFET from the region nearest to the drain wire bonding in the second drain metal bus structure DM1. Next, the current flowing therethrough diffuses to each drain of the MOSFET cells, and flows out of the sources. Afterward, the current flows out of the MOSFET from the region nearest to the source wire bonding in the first source metal bus structure SM1. In the present embodiment, the regions nearest to the wire bonding are all located at the narrow sides of the trapezoids. That is, the current flows into the MOSFET from the region having the larger resistance per unit length in the second drain metal bus structure DM1, and next, the current diffuses to other part. Accordingly, the voltage drop can be reduced because the width of the other part, which has the smaller resistance per unit length, is wider than that of the region. Similarly, the current is concentrated to the region having the larger resistance per unit length (the narrower width thereof) form the region having the smaller resistance per unit length (the wider width thereof) in the first source metal bus structure SM1, and flows out thereof, so that the voltage drop due to the current is smaller than that in the related art. In the configuration of the present embodiment consistent with the invention, the current can be effectively uniformly distributed to each of the MOSFET cells. Accordingly, the electron migration earlier occurring due to the non-uniformly distributing current can be avoided, so that the maximum withstanding current of the MOSFET is effectively enhanced.

Figure 6:
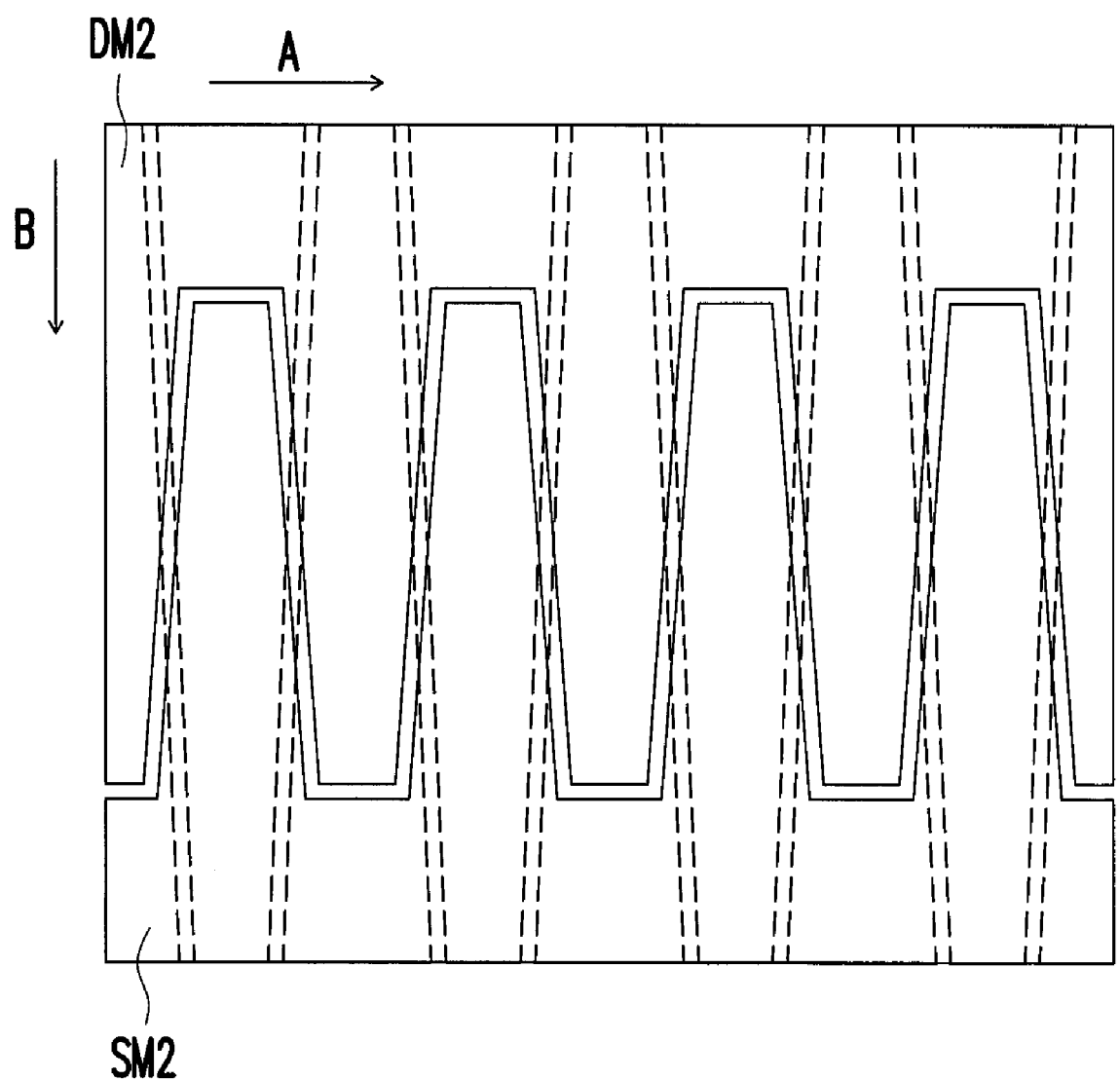
FIG. 6 is a schematic view of the second metal layer structure in the layout structure of the MOSFET according to an embodiment of the invention.

Moreover, in order to enhance the capability of the withstanding current in the MOSFET structure, besides the first source metal bus structure SM1 and the second drain metal bus structure DM1, at least one source metal bus structure and at least one drain metal bus structure can be added to the MOSFET structure to share the current, thereby reducing the current density. As a result, a larger current can be conducted in the MOSFET structure, and the current density does not cause the electron migration, too. That is, the maximum withstanding current of the MOSFET is further enhanced. FIG. 6 is a schematic view of the second metal layer structure in the layout structure of the MOSFET according to an embodiment of the invention. Referring to FIG. 6, the second metal layer structure comprises the third source metal bus structure SM2 and the fourth drain metal bus structure DM2, respectively formed on the first source metal bus structure SM1 and the second drain metal bus structure DM1. The third source metal bus structure SM2 is electrically connected to the first source metal bus structure SM1, and has a plurality of extending arms. The widths of the extending arms are gradually increased in the step-like manner, or in other similar manners, along the second direction B. The fourth drain metal bus structure DM2 is electrically connected to the second drain metal bus structure DM1, and has a plurality of extending arms. The widths of the extending arms are gradually decreased in the step-like manner, or in other similar manners, along the second direction B. The thicknesses of the third source metal bus structure SM2 and the fourth drain metal bus structure DM2 can be changed according to the required capability of the withstanding current. If the thickness is thicker, the capability of the withstanding current is higher. Moreover, it should be noted that, the wider parts of the extending arms in the fourth drain metal bus structure DM2 are connected to each other to form the region having a large area, so that the MOSFET can endure a larger instant current. The third source metal bus structure SM2 is similar thereto to endure the larger instant current. Furthermore, compared with the widths of the first source metal bus structure SM1 and the second drain metal bus structure DM1, the widths of the third source metal bus structure SM2 and the fourth drain metal bus structure DM2 changes reversely. That is, the narrow part of the first source metal bus structure SM1, for example, corresponds to the wide part of the third source metal bus structure SM2. As a result, the current redistribution by the first source metal bus structure SM1, the second drain metal bus structure DM1, the third source metal bus structure SM2, and the fourth drain metal bus structure DM2 can enhance the uniformity of the current flowing into the MOSFET cells.

To sum up, the width of the metal structure is adjusted along with the distance in the embodiments of the invention, so that the resistance per unit length is reduced along with the distance, and further, the current density is redistributed. Accordingly, the uniformity of the current flowing through the MOSFET cells in the MOSFET structure can be enhanced, thereby effectively reducing the electron migration. Moreover, another source metal bus structure and another drain metal bus structure are further provided to share the conducting current, so that the current density becomes smaller, and thereby the MOSFET cells can endure the higher conducting current.

As the above description, the invention completely complies with the patentability requirements: novelty, non-obviousness, and utility. It will be apparent to those skilled in the art that various modifications and variations can be made to the structure of the present invention without departing from the scope or spirit of the invention. In view of the foregoing descriptions, it is intended that the present invention covers modifications, and variations of this invention if they fall within the scope of the following claims and their equivalents.

What is claimed is:

1. A layout structure of a metal-oxide-semiconductor field effect transistor (MOSFET), comprising:
   a plurality of MOSFET cells;
   a first source/drain metal bus structure electrically connected to first sources/drains of the MOSFET cells, and a width of the first source/drain metal bus structure gradually decreased in a predetermined direction;
   a second source/drain metal bus structure electrically connected to second sources/drains of the MOSFET cells, and a width of the second source/drain metal bus structure gradually increased in the predetermined direction;
   a third source/drain metal bus structure electrically connected to the first source/drain metal bus structure, and a width of the third source/drain metal bus structure gradually increased in the predetermined direction;
   a fourth source/drain metal bus structure electrically connected to the second source/drain metal bus structure, and a width of the fourth source/drain metal bus structure gradually decreased in the predetermined direction;
   a first source/drain conducting wire structure electrically connected to the first sources/drains of the MOSFET cells and the first source/drain metal bus structure; and
   a second source/drain conducting wire structure electrically connected to the second sources/drains of the MOSFET cells and the second source/drain metal bus structure,
   wherein the first source/drain conducting wire structure and the second source/drain conducting wire structure are saw-toothed, and each of the first source/drain conducting wire structure and the second source/drain conducting wire structure respectively have a plural lines, in which the plural lines extend along a direction being non-parallel with the predetermined direction.

2. The layout structure of the MOSFET as claimed in claim 1, wherein the width of the first source/drain metal bus structure is gradually decreased in a step-like manner, and the width of the second source/drain metal bus structure is gradually increased in the step-like manner.

3. The layout structure of the MOSFET as claimed in claim 2, wherein an area of the first source/drain metal bus structure is equal to an area of the second source/drain metal bus structure.

4. The layout structure of the MOSFET as claimed in claim 1, wherein the width of the third source/drain metal bus structure is gradually increased in a step-like manner, and the width of the fourth source/drain metal bus structure is gradually decreased in the step-like manner.

5. The layout structure of the MOSFET as claimed in claim 4, wherein an area of the third second/drain source metal bus structure is equal to an area of the fourth source/drain metal bus structure.

6. A layout method of a metal-oxide-semiconductor field effect transistor (MOSFET), comprising:
   forming a first source/drain metal bus structure on a plurality of MOSFET cells, wherein the first source/drain metal bus structure is electrically connected to first sources/drains of the MOSFET cells, and a width of the first source/drain metal bus structure is gradually decreased in a predetermined direction;
   forming a second source/drain metal bus structure on the MOSFET cells, wherein the second source/drain metal bus structure is electrically connected to second sources/drains of the MOSFET cells, and a width of the second source/drain metal bus structure is gradually increased in the predetermined direction;
   forming a third source/drain metal bus structure on the first source/drain metal bus structure, wherein the third source/drain metal bus structure is electrically connected to the first source/drain metal bus structure, and a width of the third source/drain metal bus structure is gradually increased in the predetermined direction;
   forming a fourth source/drain metal bus structure on the second source/drain metal bus structure, wherein the fourth source/drain metal bus structure is electrically connected to the second source/drain metal bus structure, and a width of the fourth source/drain metal bus structure is gradually decreased in the predetermined direction;

forming a first source/drain conducting wire structure, wherein the first source/drain conducting wire structure is electrically connected to the first sources/drains of the MOSFET cells and the first source/drain metal bus structure; and forming a second source/drain conducting wire structure, wherein second source/drain conducting wire structure is electrically connected to the second sources/drains of the MOSFET cells and the second source/drain metal bus structure, wherein the first source/drain conducting wire structure and the second source/drain conducting wire structure are saw-toothed, and each of the first source/drain conducting wire structure and the second source/drain conducting wire structure respectively have a plural lines, in which the plural lines extend along a direction being non-parallel with the predetermined direction.

7. The layout method of the MOSFET as claimed in claim 6, wherein the width of the first source/drain metal bus structure is gradually decreased in a step-like manner, and the width of the second source/drain metal bus structure is gradually increased in the step-like manner.

8. The layout method of the MOSFET as claimed in claim 6, wherein the width of the third source/drain metal bus structure is gradually increased in a step-like manner, and the width of the fourth source/drain metal bus structure is gradually decreased in the step-like manner.

* * * * *